(12) United States Patent
Kelkar (10) Patent No.: US 8,421,995 B2
(45) Date of Patent: Apr. 16, 2013

(54) ANTI-REFLECTIVE COATING FOR OPTICAL ELEMENTS

(75) Inventor: Parag Vinayak Kelkar, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 699 days.

(21) Appl. No.: 12/574,310

(22) Filed: Oct. 6, 2009

(65) Prior Publication Data

US 2011/0080572 A1 Apr. 7, 2011

Related U.S. Application Data

(60) Provisional application No. 61/108,101, filed on Oct. 24, 2008.

(51) Int. Cl.
*B05D 5/06* (2006.01)
*G02B 1/10* (2006.01)
*G03B 27/42* (2006.01)

(52) U.S. Cl.
USPC .............................. 355/53; 359/586; 427/162

(58) Field of Classification Search ........ 355/53, 355/67, 71, 77; 359/359, 581, 585–587, 359/589, 722; 427/162, 166
See application file for complete search history.

(56) References Cited

U.S. PATENT DOCUMENTS

| | | | |
|---|---|---|---|
| 6,697,194 B2 | 2/2004 | Kuschnereit et al. | |
| 6,859,311 B2 | 2/2005 | Williams et al. | |
| 2002/0013054 A1 | 1/2002 | Farmer, II et al. | |
| 2002/0114068 A1* | 8/2002 | Kuschnereit et al. | 359/359 |
| 2005/0179996 A1* | 8/2005 | Weigl et al. | 359/359 |
| 2005/0238963 A1* | 10/2005 | Ishibashi et al. | 430/5 |
| 2006/0121361 A1 | 6/2006 | Rolfson | |
| 2007/0292772 A1 | 12/2007 | Charpin-Nicolle et al. | |
| 2008/0192335 A1* | 8/2008 | Zaczek et al. | 359/359 |
| 2009/0081813 A1* | 3/2009 | Aguado Granados et al. | 438/7 |
| 2009/0161223 A1* | 6/2009 | Ichikawa et al. | 359/601 |

FOREIGN PATENT DOCUMENTS

| | | |
|---|---|---|
| JP | 01-302723 A | 12/1989 |
| JP | 08-015856 A | 1/1996 |
| JP | 10-016026 A | 1/1998 |
| JP | 11-264902 A | 9/1999 |
| JP | 2002-250801 A | 9/2002 |
| JP | 2006-521580 A | 9/2006 |

OTHER PUBLICATIONS

English-Language Abstract for JP 01-302723 A, published Dec. 6, 1989; 1 page.
English-Language Abstract for JP 08-015856 A, published Jan. 19, 1996; 1 page.
English-Language Abstract for JP 10-016026 A, published Jan. 20, 1998; 1 page.
English-Language Abstract for JP 2002-250801 A, published Sep. 6, 2002; 1 page.
English-Language Translation of Notice of Reasons for Rejection directed to related Japanese Application No. 2009-236755, mailed Feb. 28, 2011, from the Japanese Patent Office, 4 pages.

* cited by examiner

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

An optical element including an anti-reflective coating is provided. The optical element includes a silicon substrate and a reflective layer disposed onto a first portion of the surface of the silicon substrate. An anti-reflective layer is disposed onto a second portion of the surface of the silicon substrate such that destructive interference at the anti-reflective layer substantially reduces any reflection of radiation incident on the anti-reflective layer.

14 Claims, 6 Drawing Sheets

ANTI-REFLECTIVE COATING FOR OPTICAL ELEMENTS

CROSS-REFERENCE TO RELATED APPLICATION

This application claim the benefit under 35 U.S.C. 120 of provisional application 61/108,101 filed Oct. 24, 2008. The subject matter of that provisional application is incorporated herein as if fully set forth.

BACKGROUND OF THE INVENTION

1. Field of the Invention

The present invention generally relates to lithography, and more particularly to an anti-reflective coating for optical elements.

2. Background Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a plurality of target portions that are successively patterned. Manufacturing different layers of the IC often requires imaging different patterns on different layers with different reticles. Therefore, reticles must be changed during the lithographic process.

Lithographic apparatus, and patterning devices included therein, often include one or more mirrors to reflect and redirect beams of radiation. For example, such apparatus often include micro-electromechanical systems (MEMS) that include arrays of discrete mirrors. Mirrors in such systems are formed by depositing a highly-reflective coating (e.g., layers of aluminum, aluminum oxide, silicon oxide and various metal fluorides) onto a portion of a surface of a silicon substrate to reflect incident radiation in specified manner.

However, uncoated silicon can reflect up to 60% of incident radiation at deep ultraviolet (DUV) wavelengths (as compared to less than 5% reflection from fused silica substrates or calcium fluoride ($CaF_2$) substrates over a comparable range of wavelengths). Hence, light reflected from a portion of the substrate that is intentionally not coated by the highly-reflective coating can be comparable in intensity to that of light reflected from the portions coated with the highly-reflective coating. Thus, a bare silicon surface can scatter reflected light, which can interfere with radiation reflected by the portions coated with highly-reflective coating.

As such, an anti-reflective coating is often applied to those exposed portions of the surface of the silicon substrate to substantially reduce or eliminate undesirable reflections and scattering of incident radiation. However, unlike existing mirror systems for use in lithographic apparatus that incorporate fused silica or calcium fluoride substrates, efficient, single-layer antireflective coatings are generally not possible for MEMS like optical devices that incorporate silicon substrates. Methods and systems are needed to overcome the above mentioned deficiencies.

BRIEF SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

Given the foregoing, what is needed is a single-layer anti-reflective coating for a silicon substrate that substantially reduces or eliminates reflection of radiation (e.g. DUV radiation at 193 nm) incident on the substrate. To meet this need, embodiments of the present invention are directed to single-layer, anti-reflective coatings for silicon substrates.

In an embodiment, an optical element includes a silicon substrate and a reflective layer disposed onto a first portion of the surface of the silicon substrate. An anti-reflective layer is disposed onto a second portion of the surface of the silicon substrate, and destructive interference at the anti-reflective layer substantially reduces any reflection of radiation incident on the anti-reflective layer.

In a further embodiment, a lithographic apparatus including a support structure configured to support a patterning device that is configured to pattern a beam of radiation from an illumination system and a projection system configured to project the patterned beam towards an optical element support configured to support the optical element is provided. The optical element includes a silicon substrate and a reflective layer disposed onto a first portion of the surface of the silicon substrate. An anti-reflective layer is disposed onto a second portion of the surface of the silicon substrate, and the anti-reflective layer substantially eliminates through destructive interference any reflection of radiation incident on the anti-reflective layer.

In a further embodiment, a method for making an optical element disposes a reflective layer onto a first portion of a surface of a silicon substrate and disposes an anti-reflective layer onto a second portion of the surface of the silicon substrate. The second disposing step includes determining a composition of the oxide layer and a thickness of the oxide layer to generate destructive interference that substantially reduces reflection of radiation incident on the anti-reflective layer. In an embodiment, the incident radiation has a wavelength of 193 nm.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

The invention will be better understood from the following descriptions of various embodiments of the invention. Thus, specific embodiments are views of the invention, but each does not itself represent the whole invention. In many cases individual elements from one particular embodiment may be substituted for different elements in another embodiment carrying out a similar or corresponding function.

I. Overview

The present invention is directed to single-layer, anti-reflection coatings for silicon substrates. This patent document describes one or more embodiments that incorporate the features of this invention. These embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

II. Example Reflective and Transmissive Lithographic Systems

Figure 1A:
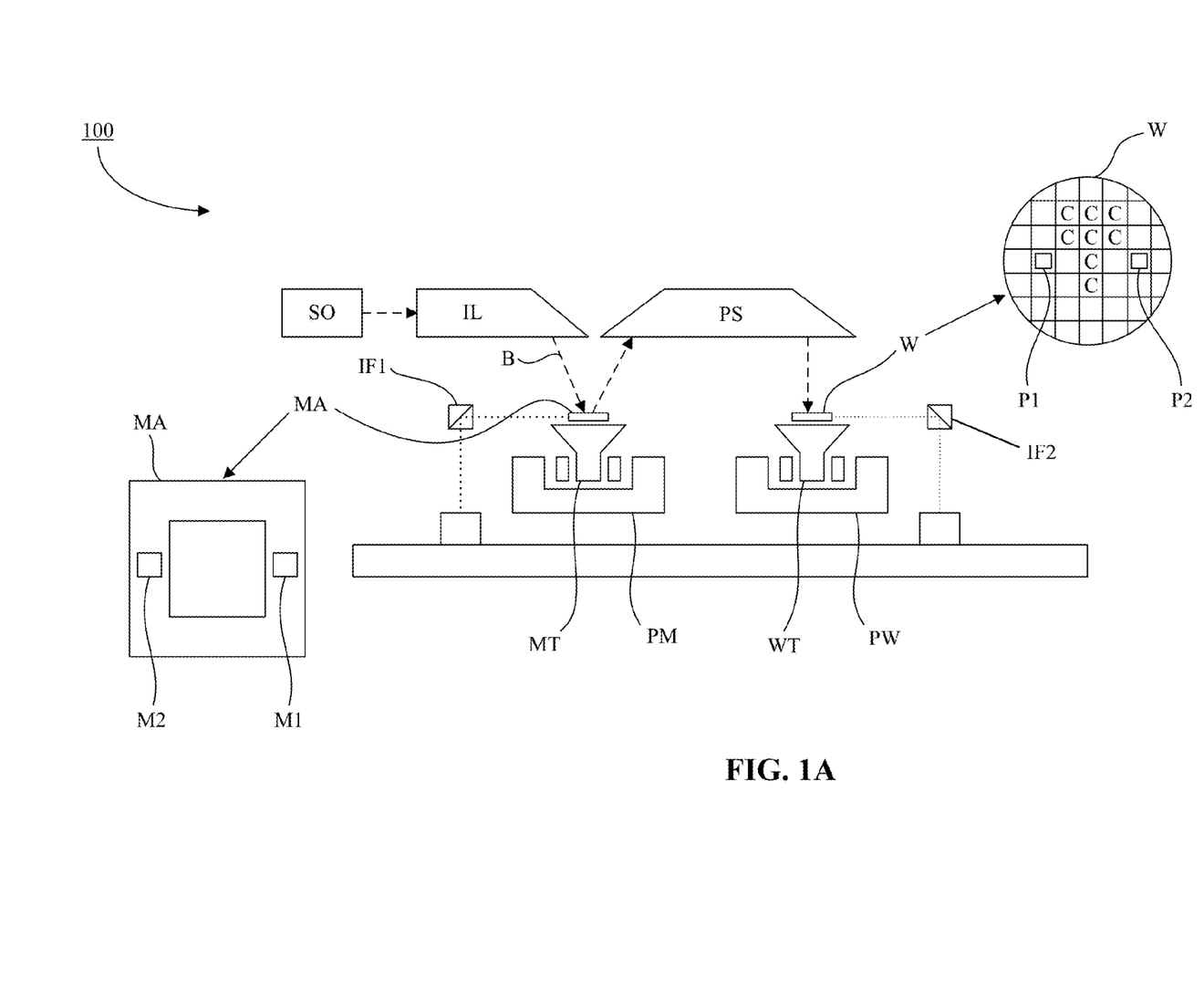
Figure 1B:
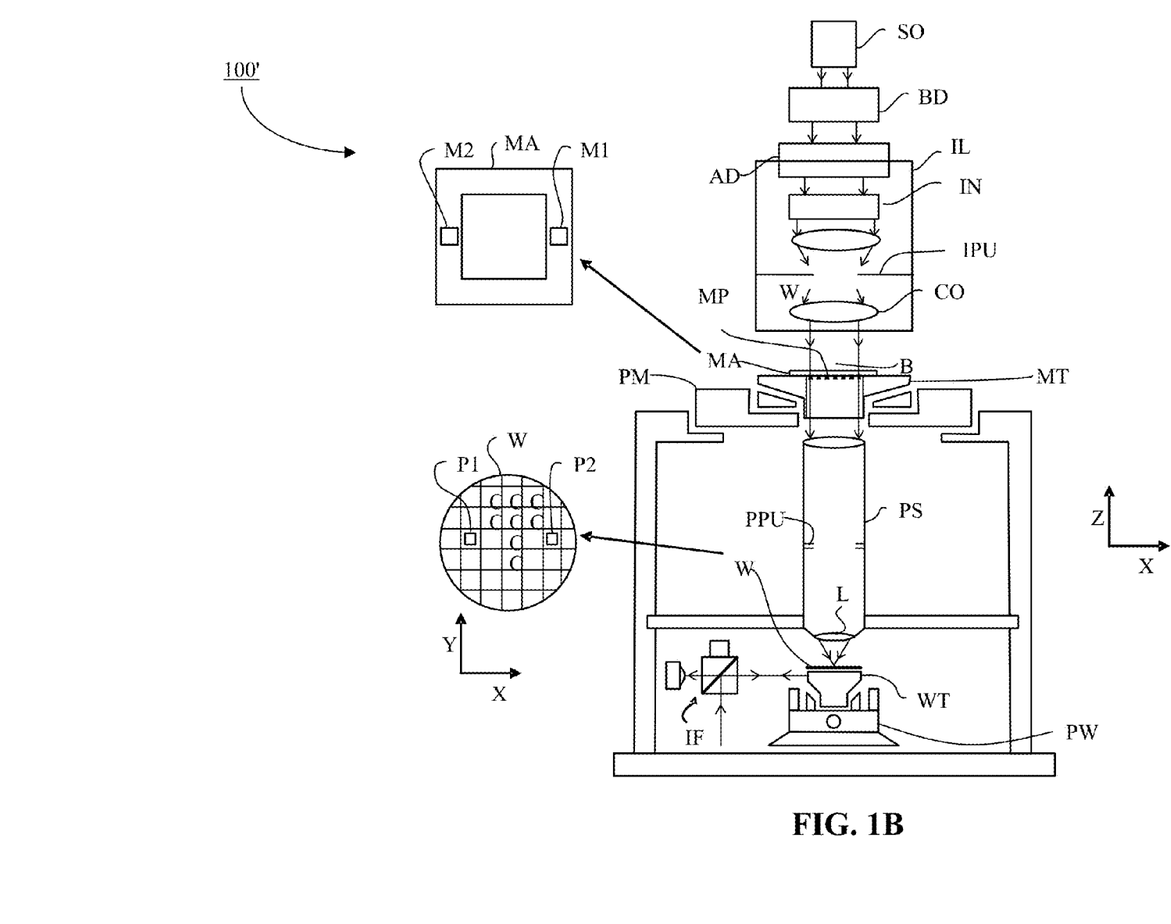

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100', for example, when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA) having a mask pattern MP, which is held on the support structure (e.g., mask table MT), and is patterned by the patterning device. Having traversed the mask MA, the radiation beam B passes through the projection system PS, which focuses the beam onto a target portion C of the substrate W. Projections system PS includes pupil PPU and aperture device PD. PD may be, for example, a programmable LCD array. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

III. Exemplary Single-Layer Anti-Reflective Coatings for Silicon Substrates

In order to form an efficient single-layer anti-reflective coating on any material, a refractive index of the coating material should be approximately equivalent to a square root of the substrate material. Conventional anti-reflective compounds, such as metal fluorides, silicon dioxide, aluminum oxide do not satisfy this optical constraint over a range of wavelengths in the DUV radiation range, e.g., 193 nm. As such, conventional anti-reflective coatings for silicon substrates generally incorporate two or more discrete layers of conventional coating materials, such as metal fluorides, silicon dioxide, aluminum oxide, silicon nitride, and silicon oxynitride. Embodiments presented herein provide a single-layer anti-reflective coating of the required thickness and composition to substantially eliminate radiation incident on the anti-reflective layer.

Figure 2A:
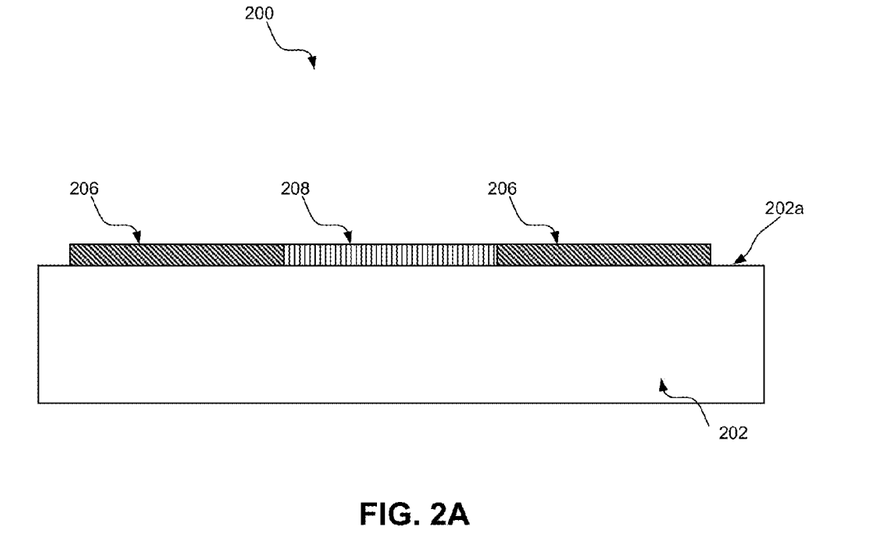
FIG. 2A schematically depicts features of an exemplary optical element having a single-layer, anti-reflective coating, according to an embodiment of the present invention.

FIG. 2A illustrates an example optical element 200 according to an embodiment of the invention. Optical element 200 comprises silicon substrate 202, reflective coating 206 and anti-reflective coating 208. Reflective coating 206 and anti-reflective coating 208 are deposited on a surface 202a of silicon substrate 202. In an embodiment, optical element 200 is a micro electro-mechanical system (MEMS) device with reflective coating 206 forming a mirror surface that substantially reflects all the light incident on it. Reflective coating 206 maybe formed by deposition of reflective materials such as aluminum, aluminum oxide, silicon oxide or metal fluorides. It is to be appreciated by a person of skill in the art that the type of material(s) used to form reflective surface 206 may be arbitrary based on design requirements.

According to an embodiment of the invention, to prevent light reflected/scattered from surface 202a of silicon substrate 202 from interfering with light reflected from reflective coating 206, a single layer of anti-reflective coating 208 having a specific composition and thickness is applied on portions of surface 202a of silicon substrate 202 that are not covered by reflective coating 206. In many cases, the anti-reflective coating will be applied to all portions of surface 202a that are not covered by reflective coating 206. In other cases, the anti-reflective coating will not be applied to all portions of surface 202a that are not covered by reflective coating 206. According to an embodiment of the invention, to substantially minimize reflection of light incident on anti-reflective coating 208, a refractive index of anti-reflective coating 208 should be appropriately equal to a square root of the refractive index of the underlying silicon substrate 202. Thus, if the refractive index of the silicon substrate is n then the refractive index of the anti-reflective coating should be approximately equal to $\sqrt{n}$. At this refractive index, light reflected from the anti-reflective coating 208 destructively interferes with the light reflected from underlying surface 202a thereby substantially eliminating reflection of light incident on anti-reflective coating 208. The composition and thickness of the anti-reflective coating 208 to minimize reflection is based in part on the wavelength of incident radiation.

According to an embodiment of the invention, a single 10 nm layer of hafnium oxide anti-reflective coating 208 is deposited on surface 202a of silicon substrate 202 to minimize reflection of light having a wavelength of 193 nm. A single layer of hafnium oxide of the desired thickness and composition may be deposited using, for example, ion assisted electron beam (E beam) deposition. Ion assisted electron beam deposition includes the steps of vaporizing hafnium using the electron beam in the deposition chamber while introducing controlled amounts of Oxygen in the deposition chamber. Ion assist along with the level of Oxygen introduced into the deposition chamber is used for controlling composition of hafnium oxide. Controlling the Oxygen content allows for tuning the refractive index of hafnium oxide to be a $\sqrt{n}$, where n is the refractive index of silicon substrate 202. Reflective coating 206 maybe deposited on silicon substrate surface 202a using techniques such as sputtering, Chemical Vapor Deposition (CVD) or Physical Vapor Deposition (PVD). The composition and thickness of the anti-reflective coating 208 is configured to generate a single layer coating that satisfies the optical constraint of the refractive index of anti-reflective coating 208 being a square root of the refractive index of silicon substrate 202. In an embodiment, the thickness and composition of anti-reflective coating 208 is configured to cause destructive interference between light reflected from anti-reflective coating 208 and the light reflected from underlying substrate 202 such that the destructive interference results in substantially negligible reflection of light incident on anti-reflective coating 208. In alternate embodiments, other oxides of hafnium, oxides of tantalum, niobium, titanium and silicon nitride of the appropriate thickness may be used to form anti-reflective coating 208.

Figure 2B:
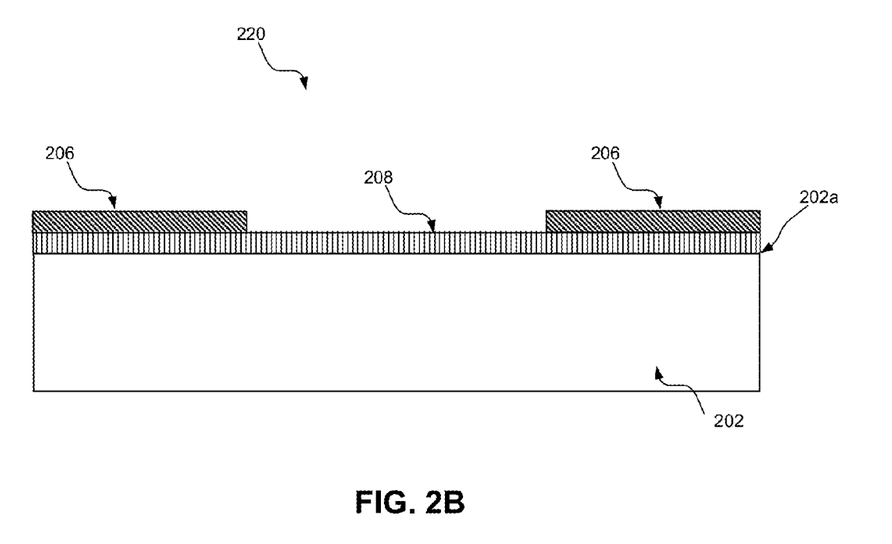
FIG. 2B schematically depicts features of an exemplary optical element having a single-layer, anti-reflective coating, according to a further embodiment of the present invention.

FIG. 2B illustrates an example optical element 220 according to an embodiment of the invention. Optical element 220 comprises silicon substrate 202, reflective coating 206 and anti-reflective coating 208. In the present embodiment, anti-reflective coating 208 is deposited over the entire surface 202a of substrate 202. Reflective coating 206 is deposited on top of anti-reflective coating 208. Depositing anti-reflective coating 208 throughout the surface 202a has the advantage of reducing the number of process steps required to fabricate optical element 202 since anti-reflective coating does not have to be deposited on selective portions on surface 202a as in FIG. 2A. Anti-reflection coating 208 is typically very thin and does not interfere with the performance of the reflective coating 206.

A single layer of hafnium oxide of the desired thickness and composition may be deposited using, for example, ion assisted electron beam (E beam) deposition as described above. In an embodiment, a single 10 nm layer of hafnium oxide anti-reflective coating 208 is deposited on the entire surface 202a of silicon substrate 202 to minimize reflection of light having a wavelength of 193 nm. Reflective coating 206 maybe deposited on top of anti-reflective coating 208 using techniques such as sputtering, Chemical Vapor Deposition (CVD) or Physical Vapor Deposition (PVD).

Figure 3A:
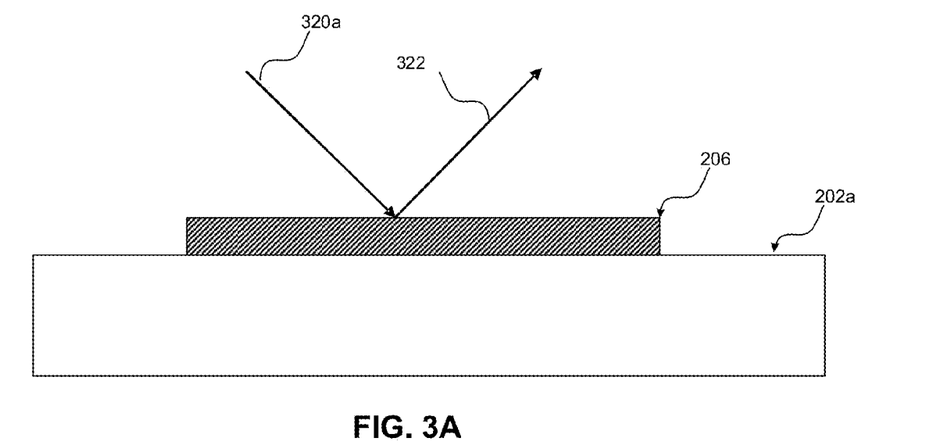
FIGS. 3A and 3B depict reflective features of the exemplary optical element of FIG. 2.

FIG. 3A illustrates the reflective properties of reflective coating 206 according to an embodiment of the invention. Reflective coating 206 deposited on substrate surface 202a causes incident light 320a to be substantially totally reflected as beam 322 with almost negligible amounts of light passing through reflective coating 206 to substrate 202a. Anti-reflective coating 206 is used to prevent interference of light reflected from surface 202a with light reflected from reflective coating 206.

Figure 3B:
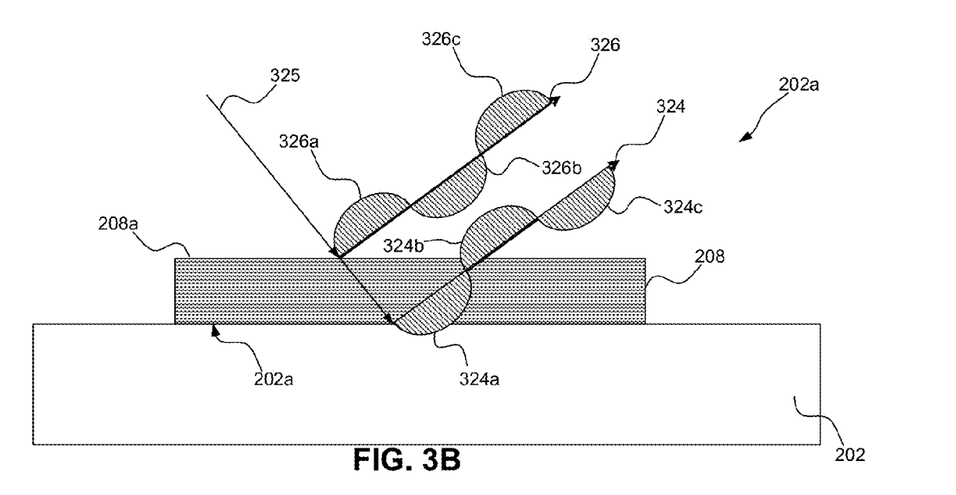

FIG. 3B schematically illustrates the reflective properties of anti-reflective coating 208 according to an embodiment of the invention. A beam of light 325 incident on surface 208a of anti-reflective coating 208 reflects as beam 326. Beam 325 also partially passes through anti-reflective coating 208 to reflect from surface 202a as beam 324. According to an embodiment of the invention, the composition and thickness of anti-reflective coating 208 causes the peaks and troughs of beam 326 and beam 324 to interfere destructively thereby resulting in negligible reflection of incident light 325. Beam 326 comprises a peak 326a, a trough 326b and a peak 326c. Beam 324 comprises a trough 324a, a peak 324b and a trough 324c. As seen in FIG. 3B, the peaks and troughs of beam 326 and beam 324 have opposite phases that result in destructive interference. Peak 326a and trough 324a interfere destructively. Similarly, peak 324b and trough 326b; and peak 326c and trough 324c interfere destructively thereby substantially eliminating reflection of incident light 325. In an embodiment, a 10 nanometer (nm) layer of anti-reflective coating 208 of hafnium oxide causes less than 0.2 percent reflection when the wavelength of incident light 325 is 193 nm and the underlying substrate 202 is silicon.

Figure 4:
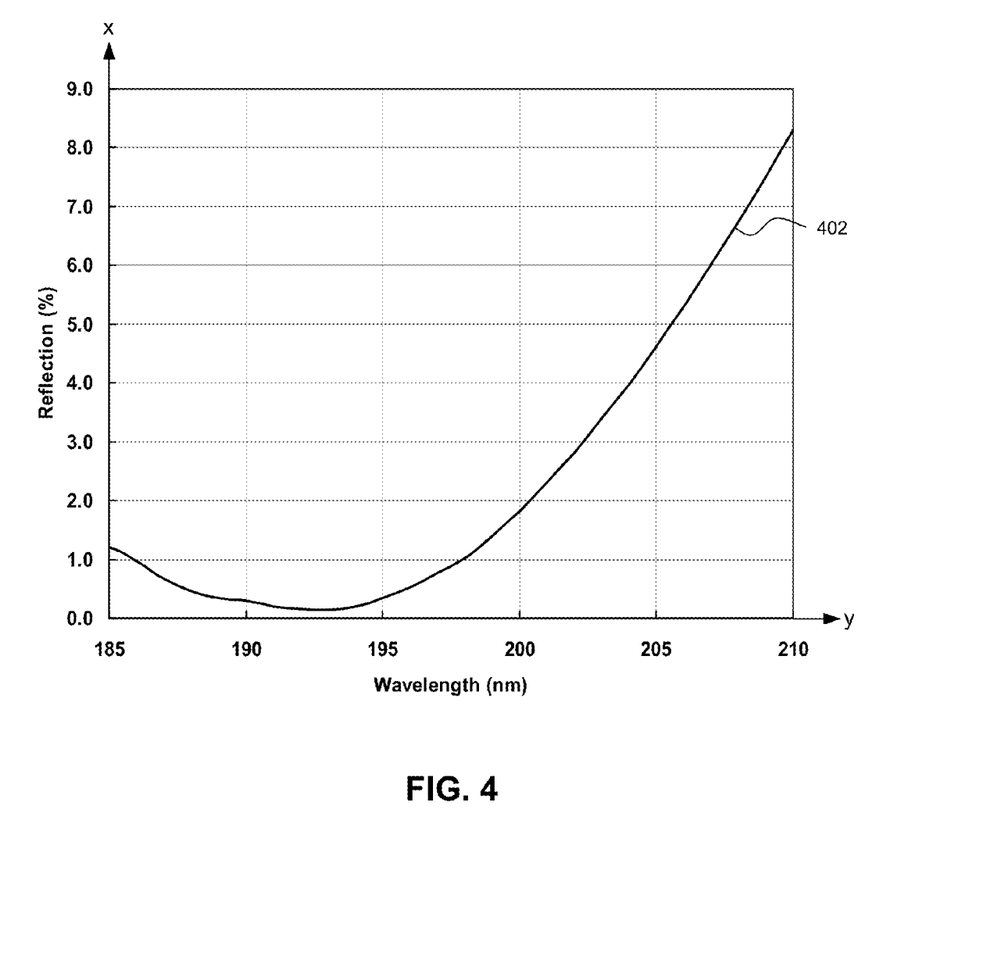
FIG. 4 illustrates a graph showing percentage reflection of an anti-reflective coating of a particular composition and thickness for incident light in range of wavelengths.

FIG. 4 illustrates a graph 402 showing percentage reflection from an anti-reflective coating of hafnium oxide having a thickness of ten nanometer for incident light ranging in wavelength from 185 nm to 210 nm. As seen in FIG. 4, percentage reflection from the anti-reflective coating is lowest at approximately 193 nm for the specific composition of hafnium oxide at a thickness of 10 nm. It is to be appreciated by a person of skill in the art, that the percentage reflection at a particular wavelength is based on the composition and thickness of the material used to form the anti-reflective coating and the underlying substrate and can be modified based on implementation requirements.

Figure 5:
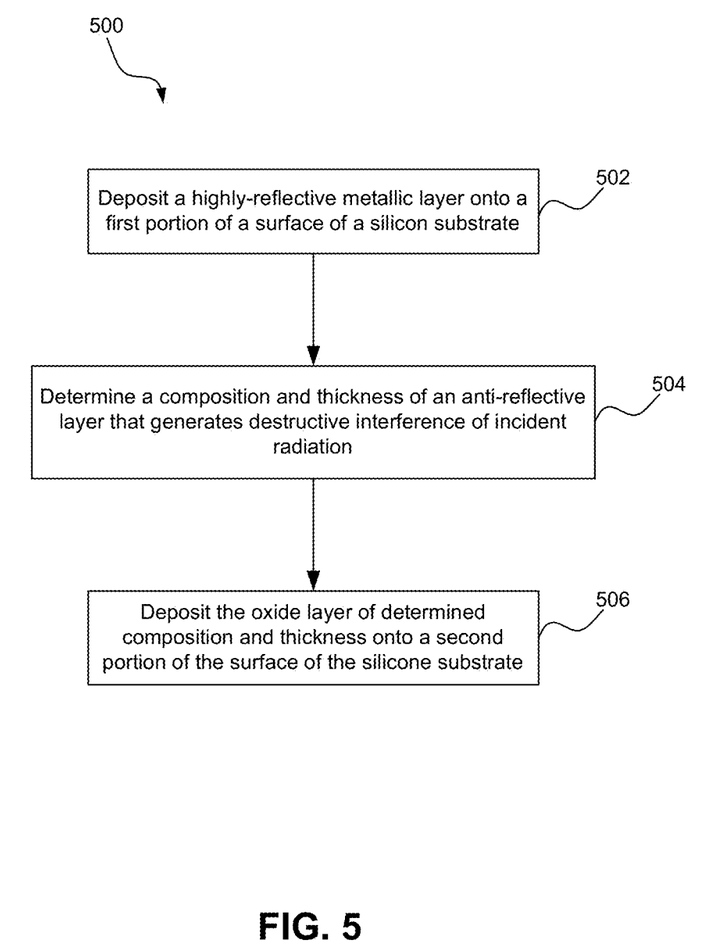
FIG. 5 depicts an exemplary method for making an optical element having a single-layer, anti-reflective coating, according to an embodiment of the present invention.

FIG. 5 illustrates an example flowchart 500 illustrating steps performed to create an anti-reflective coating that substantially eliminates reflection of incident light according to an embodiment of the invention. Flowchart 500 will be described with continued reference to the example embodiments depicted in FIGS. 2-3. However, flowchart 500 is not limited to these embodiments. Note that some steps shown in flowchart 500 do not necessarily have to occur in the order shown.

In step 502, a highly reflective metallic layer is deposited onto a portion of a silicon substrate. For example, a highly reflective coating of aluminum, aluminum oxide or silicon oxide is deposited on surface 202a of substrate 202.

In step 504, a composition and thickness of an anti-reflective material that causes destructive interference of radiation of a particular wavelength reflected from the surface of the anti-reflective material and the underlying substrate is determined. For example, composition and thickness of anti-reflective coating 208 is determined so that beam 325 reflected from a surface 208a interferes destructively with beam 324 reflected from surface 202a of substrate 202. In an embodiment, a composition of hafnium oxide at a thickness of 10 nm that causes destructive interference of incident light at 193 nm is used.

In step 506, the anti-reflective layer of the determined composition and thickness is deposited onto a portion of the silicon substrate that is not covered by the metallic layer described in step 502. For example, anti-reflective layer 208 of the determined thickness (10 nm) and composition (hafnium oxide) is deposited on portions 202a of silicon substrate 202 that are not covered by reflective coating 206. Hafnium oxide may be deposited by, vaporizing Hafnium within the deposition chamber and introducing controlled amounts of oxygen into the chamber so as to form an anti-reflective coating of hafnium oxide of the determined thickness and composition. Ion assist may be used to control the composition of Hafnium oxide. The highly reflective metallic layer may be deposited onto the surface by using techniques such as sputtering, CVD or PVD. The reflective layer may include one or more of aluminum, an oxide of aluminum, an oxide of silicon and a fluorinated metallic compound. The reflective layer is substantially reflective to a pre-determined incident radiation, e.g. 193 nm.

IV. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An optical element, comprising:
a silicon substrate;
a reflective layer disposed onto a first portion of a surface of the silicon substrate; and
an anti-reflective layer disposed onto a second portion of the surface of the silicon substrate,
wherein the anti-reflective layer comprises hafnium oxide (HfOx),
wherein the thickness of the anti-reflective layer is approximately 10 nm, and
wherein the anti-reflective layer is configured to generate destructive interference between light reflected from the anti-reflective layer and light reflected from the silicon substrate in order to substantially eliminate reflection of radiation of a predetermined wavelength incident on the anti-reflective layer.

2. The optical element of claim 1, wherein the anti-reflective layer has a refractive index that is approximately equivalent to square root of a refractive index of the silicon substrate.

3. The optical element of claim 1, wherein the anti-reflective layer has a composition and a thickness configured to generate destructive interference of incident radiation at the predetermined wavelength of approximately 193 nm.

4. The optical element of claim 1, wherein the anti-reflective layer reflects less than approximately 0.2% of incident radiation at the predetermined wavelength of approximately 193 nm.

5. The optical element of claim 1, wherein the anti-reflective layer comprises an oxide of tantalum, an oxide of titanium, an oxide of niobium, or silicon nitride.

6. The optical element of claim 1, wherein the reflective layer is substantially reflective to radiation at the predetermined wavelength of about 193 nm.

7. The optical element of claim 1, wherein the reflective layer comprises one or more of aluminum, an oxide of aluminum, an oxide of silicon, or a fluorinated metallic compound.

8. A lithographic apparatus, comprising:
a support structure configured to support a patterning device that is configured to pattern a beam of radiation from an illumination system; and
a projection system configured to project the patterned beam towards an optical element support configured to support an optical element, the optical element comprising:
a silicon substrate;
an anti-reflective layer disposed onto the entire surface of the silicon substrate,
wherein the anti-reflective layer comprises hafnium oxide (HfOx),
wherein the thickness of the anti-reflective layer is approximately 10 nm, and
wherein the anti-reflective layer is configured to generate destructive interference between light reflected from the anti-reflective layer and light reflected from the silicon substrate in order to substantially eliminate reflection of radiation of a predetermined wavelength incident on the anti-reflective layer; and
a reflective layer disposed onto a portion of a surface of the anti-reflective layer.

9. The lithographic apparatus of claim 8, wherein the anti-reflective layer has a refractive index that is approximately equivalent to square root of a refractive index of the silicon substrate.

10. The lithographic apparatus of claim 8, wherein the anti-reflective layer has a composition and a thickness configured to generate destructive interference of incident radiation at the predetermined wavelength of about 193 nm.

11. The lithographic apparatus of claim 8, wherein the anti-reflective layer reflects less than approximately 0.2% of incident radiation at the predetermined wavelength of about 193 nm.

12. The lithographic apparatus of claim 8, wherein the anti-reflective layer comprises an oxide of tantalum, an oxide of titanium, an oxide of niobium, or silicon nitride.

13. The lithographic apparatus of claim 8, wherein the reflective layer is substantially reflective to radiation at the predetermined wavelength of about 193 nm.

14. The lithographic apparatus of claim 8, wherein the reflective layer comprises aluminum, an oxide of aluminum, an oxide of silicon, or a fluorinated metallic compound.

* * * * *